(12) United States Patent
Bordogna et al.

(10) Patent No.: US 6,352,876 B1
(45) Date of Patent: Mar. 5, 2002

(54) INTEGRATED SEMICONDUCTOR OPTIC SENSOR DEVICE AND CORRESPONDING MANUFACTURING PROCESS

(75) Inventors: Matteo Bordogna, Bellusco; Enrico Laurin, Lissone; Oreste Bernardi, Bernareggio, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/626,836

(22) Filed: Jul. 27, 2000

Related U.S. Application Data

(63) Continuation-in-part of application No. 09/362,427, filed on Jul. 28, 1999.

(30) Foreign Application Priority Data

Jul. 28, 1999 (IT) .......................................... MI99A1680
Mar. 6, 2000 (EP) ............................................. 00104800

(51) Int. Cl.[7] .............................................. H01L 21/00
(52) U.S. Cl. ......................................................... 438/69
(58) Field of Search ............................... 438/69, 70–81, 438/85–86, 57; 257/414, 431–437

(56) References Cited

U.S. PATENT DOCUMENTS

| 5,268,309 A | | 12/1993 | Mizutani et al. ................ 437/3 |
| 5,801,373 A | * | 9/1998 | Oozu et al. ............... 250/208.1 |
| 6,019,848 A | | 2/2000 | Frankel et al. ............... 118/715 |

* cited by examiner

*Primary Examiner*—Charles Bowers
*Assistant Examiner*—Craig Thompson
(74) *Attorney, Agent, or Firm*—Lisa K. Jorgenson; Robert Iannucci; Seed IP Law Group, PLLC

(57) ABSTRACT

The invention relates to a process for manufacturing a light sensor device in a standard CMOS process, including, implanting active areas on a semiconductor substrate to obtain a first integrated region of a corresponding photosensor; and forming a stack of layers having different thickness and refractive index layers over the photosensor to provide interferential filters for the same photosensor. At least one of the above mentioned layers is formed by a transparent metallic oxide having a high refraction index and a corresponding high dielectric constant. In this manner, due to the transparency of the high refraction index material, the design of interferential resonators is rendered more flexible making possible the use of a stack of layers including more than one high refraction index layer.

22 Claims, 1 Drawing Sheet

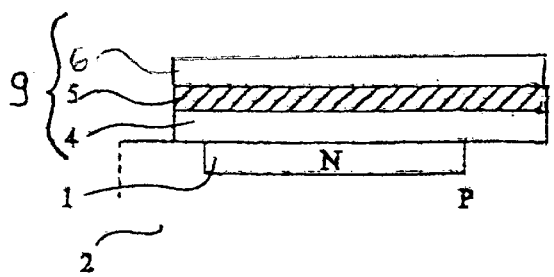 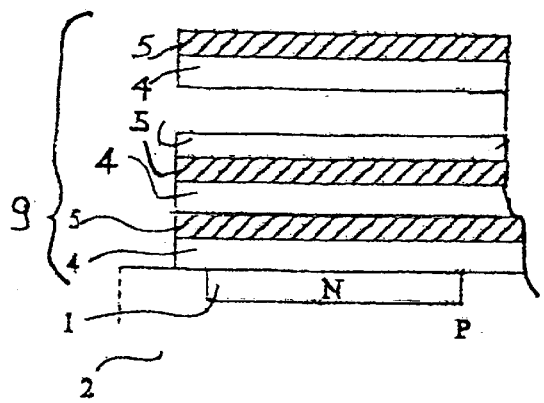
Fig 1    Fig 2
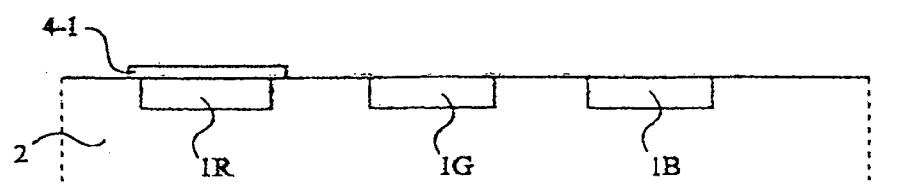
Fig 3
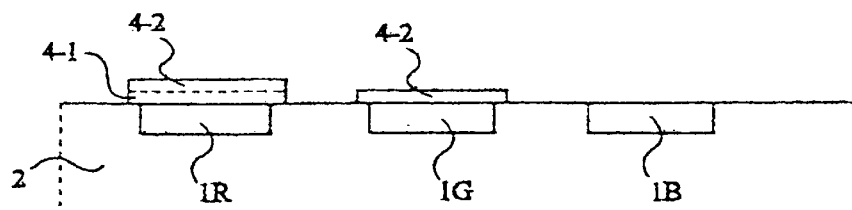
Fig 4
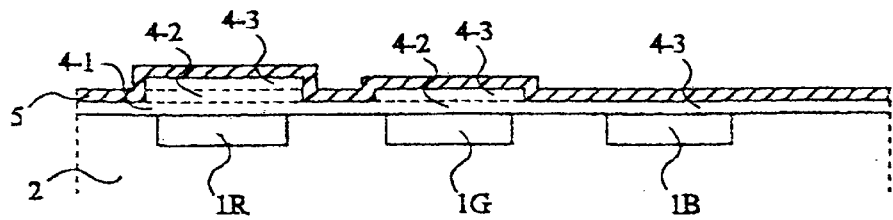
Fig 5

INTEGRATED SEMICONDUCTOR OPTIC SENSOR DEVICE AND CORRESPONDING MANUFACTURING PROCESS

This application is a C-I-P of Ser. No. 09/362,427 filed Jul. 28, 1999.

TECHNICAL FIELD

The present invention relates to an integrated semiconductor optic sensor device having a desired spectral selectivity and obtained by a standard CMOS process.

One of the most important fields of application for these types of devices is for integrated color sensitive photosensors, for instance for color images or a color television camera.

BACKGROUND OF THE INVENTION

Optical light sensors based on semiconductor properties are widely used for several video image applications. Various techniques may be used for optical to electrical conversion. One of the most effective is based on electron-hole generation due to the light absorption of a semiconductor reverse biased photodiode.

Since the final effect of the electron-hole generation doesn't represent the wavelength of the absorbed light in the optical range, this physical mechanism cannot be directly used to distinguish different colors.

To implement color sensitivity, a series of colored filters is generally provided between the light source and the photosensitive device. This is usually implemented by a deposition of an organic colored resin over the finished semiconductor photosensitive device. This resin stops by absorption the unwanted colors of the incident light and transmits to the light sensor only the light wavelengths to be selected. In this manner the electric signal generated in the semiconductor device is correlated to the desired color only.

In the case of color selectivity used for CMOS video cameras, the photodiodes are integrated on silicon to form a bidimensional matrix. From the top view each diode looks squared. Each diode is electrically insulated from the other adjacent diodes by an isolation region, for instance a field oxide.

To clearly detect color images, the semiconductor matrix includes at least three different kind of staggered diodes, which are sensitive to blue, green and red light respectively.

The main drawbacks of the photodiodes covered by the organic resin are that the resin deposition requires an additional process step once the diodes are formed, and that the filter thus created absorbs a portion of the incident light, thereby reducing the diode sensitivity.

Moreover, long exposure to intense light, humidity, high temperature and ionizing radiation may reduce the ability of the organic resins to block the unwanted colors.

A prior art solution for providing color selectivity is disclosed in the European patent No. 0152353, which relates to method and device for obtaining a color selecting effect based on the wave properties of the light. This method may be implemented during the semiconductor device manufacturing process instead of on the finished sensor.

Briefly, this method includes depositing a stack of inorganic layers over the light sensor device. These layers have suitable thicknesses and indexes of refraction.

By a suitable definition of the stack structure, it is possible to obtain the desired spectral transmission of the incident light toward the semiconductor sensor device.

By modulating the interference of the light waves reflected at all the layer interfaces of the stack it is possible to maximize or minimize the light intensity transmitted or reflected by the entire stack in pre-determined wavelength ranges, that is, colors.

The method disclosed in the above cited European patent is based on the construction of an optical resonant semiconductor stack formed by the following layers: Monosilicon-Oxide-Polysilicon.

The incident light is reflected by the interface of the monosilicon/oxide and interferes with the light reflected by the other interface of oxide/polysilicon.

The above disclosed method of wavelength selection by interference creates a more reliable sensor than the sensor covered by conventional organic resins, because the conventional organic resins have a tendency to breakdown over time, as discussed above. This better reliability is appreciated especially in those application fields where high temperature or humidity is present, or in cases of high light exposure of the sensor, or even in presence of ionizing radiations.

Moreover, the interferential technique can be integrated in standard VLSI semiconductor processes without the need of a dedicated and separated process and environment to apply color selecting resins on the finished sensor.

As explained above, interferential stacks are formed by materials having a high and a low refraction index, respectively. Polysilicon, or amorphous silicon, is generally used as high refraction index material, while silicon dioxide is commonly used as low index material.

The use of Polysilicon leads to an intrinsic parasitic absorption of light that involves a consequent loss of a portion of the optical signal before it reaches the sensor.

This fact limits the use of the interferential method to the construction of simple resonators with one or very few layers of a very thin high index material, for instance few hundreds of Angstrom. This is a severe limitation on the large variety of possible transmission spectra theoretically obtained with the interferential method.

Until now, no device has been produced that can preserve the interferential properties of the integrated stack sensors, while also avoiding the excessive absorption of light within the interferential stack.

SUMMARY OF THE INVENTION

Embodiments of the present invention use a high refraction index layer having the highest possible transparency, for instance a transparent metallic oxide having a high dielectric constant, in order to improve the current interferential applications. These improvements, included in applications such as video cameras, greatly widen the field of application of integrated interferential photodetectors.

Embodiments also improve the spectral sensitivity of the photodetectors that is not available with the standard colored resins or with interferential integrated stacks of known type that make use of the polysilicon layer.

Embodiments of the invention also make the design of resonators more flexible by increasing the complexity of interferential stacks by including any number of high refraction index layers and low refraction index layers, thereby achieving a wide range of spectral transmission curves.

Presented is a device and a process for manufacturing a light sensor device in a standard CMOS process. During fabrication, the active areas on a semiconductor substrate are implanted to obtain at least a first integrated region of a corresponding photosensor. Then a stack of layers having different thickness and refractive index over the photosensor are formed to provide an interferential filter for the photosensor. At least one of the layers in the stack is formed by a transparent metallic oxide having a high refraction index.

In this manner, the design of interferential resonators is rendered more flexible because a stack of layers including more than one high refraction index layer is possible. This possibility wasn't previously currently available since non totally transparent high index materials, such as polysilicon, are currently used according to the teaching of the prior art solutions.

The features and advantages of the invention will become apparent from the following description of an embodiment thereof, given by way of non-limiting example with reference to the accompanying drawings.

BRIEF DESCRIPTION OF THE DRAWINGS

FIG. 1 is a cross sectional view of a semiconductor portion including a light sensor device manufactured according to an embodiment of the present invention.

FIG. 2 is a cross sectional view of a semiconductor portion including a light sensor device according to another embodiment of the present invention.

FIG. 3 is a cross sectional view of a semiconductor portion at the beginning of the inventive manufacturing process, according to an embodiment of the invention.

FIG. 4 is a cross sectional view of the semiconductor portion shown in FIG. 3 during a further process step.

FIG. 5 is cross sectional view of the semiconductor portion of FIGS. 3 and 4 showing three photodiodes obtained by the manufacturing process according to an embodiment of the invention.

DETAILED DESCRIPTION OF THE INVENTION

With reference to the drawing figures, generally and schematically shown in FIG. 1 is a light sensor device 1 including an interferential colored filter 9 according to an embodiment of the present invention.

The process steps and the structures described herein below do not form a complete process flow for manufacturing integrated circuits. This invention can be practiced jointly with integrated circuit manufacturing techniques currently used in the art, and only those common process steps will be discussed herein as are necessary to an understanding of the invention. The drawing figures which show cross-sections through a semiconductor wafer are not drawn to scale but rather to highlight major features of the invention. Discussion of steps or devices well known to those skilled in the art has been eliminated for brevity.

The light sensor device 1 may be considered an integrated photodiode which is formed over a semiconductor substrate 2 region of a first conductivity type, for instance a P doped semiconductor region.

This semiconductor substrate 2 can also host other CMOS circuit components, for instance driver circuitry and other control circuits for the photodiode, which are formed according to a conventional and standard CMOS process flow.

The substrate 2 is generally formed of monocrystalline silicon and will be discussed hereinafter as a monosilicon substrate, although any other suitable material is acceptable. The photodiode 1 includes a first region formed by the monocrystalline silicon of the substrate 2 and a second monocrystalline region having a doping type, opposite to the substrate, shown as the first region 1 in FIG. 1.

Over the first region 1 is a stack formed by a multilayer structure that can include a low refractive index dielectric layer, such as a silicon oxide layer 4 and a high refractive index layer 5, for instance a transparent metallic oxide having a high refraction index and a corresponding high dielectric constant.

For some applications, optionally, it might be advisable to use a further layer 6 formed by a silicon nitride layer above the high refractive index layer 5.

The stack including the layers 4, 5 and 6 above the substrate 2, presents different thicknesses and refractive indexes and represents an interferential filter 9.

The first region 1 in the monosilicon substrate 2 and the transparent metallic oxide layer used as the high refractive index layer 5 both have a high refraction index, while the silicon oxide layer 4 and the optional silicon nitride layer 6 have lower refraction indexes.

Shown in FIG. 2 is that a number of the layers 4, 5, and perhaps 6 can be formed, one over another, to form the interferential filter 9 having the qualities desired to filter wavelengths presented to the photodiode 1.

Taught in EP 0152353 is that the thickness of the various layers must be defined to assure an anti-reflection effect and a filtering effect according to a specific desired light wavelength.

With specific reference to the examples of the Figures from 3 to 5, the process according to an embodiment of the present invention is now discussed.

FIG. 3 shows a monosilicon semiconductor portion 2 including three different diode cathode regions 1R, 1G, 1B, respectively. These regions will be sensitive to Red, Green and Blue colors respectively.

These regions 1R, 1G, 1B are defined by a photolithografic process step that provides for a resist deposition and etching steps followed by a Source/Drain implantation of the areas of the diodes' that are not covered by a dielectric layer, as in a standard CMOS process.

According to this process, silicon oxide layers having different thickness are respectively deposited over these three regions 1R, 1G, 1B.

A first process step shown in FIG. 3 provides for the deposition of a first oxide layer 4-1 only over the first cathode region 1R, and not over the regions 1G and 1B.

More specifically, a blanket oxide deposition of the first oxide layer 4-1 is performed over the entire substrate 2 surface. Then a mask is provided to protect the area of the cathode region 1R where the Red photosensor will be formed. A subsequent oxide etching and resist mask removal clears the areas of the first oxide layer 4-1 other than from over the region 1R.

A further process step is then performed to cover the second cathode region 1G and the first oxide layer 4-1 with a second oxide layer 4-2, as shown in FIG. 4. The step includes a blanket oxide deposition performed over the entire substrate 2 surface. A mask is provided to protect the area of the cathode regions 1R and 1G where the Red and the Green photosensors will be formed. A subsequent oxide etching and resist mask removal clears the area other than from over the regions 1R and 1G.

The process proceeds with a further oxide deposition step to cover the entire semiconductor portion shown in FIG. 5 with a third oxide layer 4-3.

Advantageously, this third oxide layer 4-3 is a protecting (undoped) dielectric layer, for instance a USG type layer, which is often used as a first layer of pre-metal dielectric over a polysilicon layer. In standard CMOS processes the pre-metal dielectric, which is the insulator deposited before metal interconnections, is generally a stack of a first protecting dielectric, undoped and not planarizing, followed by a second, and usually doped, planarizing dielectric.

This third oxide layer 4-3 is not etched between two adjacent photosensors. This forms a better planarized structure than had the masking and etching taken place as in the earlier steps, even if the USG oxide is a conformal layer.

Moreover, the thicknesses of the three oxide layers, by suitable deposition and etching phases, may be regulated according to the needs to bring the total thickness of the oxide stacks to a value multiple of the L/2, where L is a given wavelength of the incident light. For instance, it is possible to obtain a layer thickness of n*L/2, where n may be an integer number.

Then the high refractive index layer 5, of a transparent metallic oxide type having a high dielectric constant with a corresponding high refraction index, is deposited over the third oxide layer 4-3.

This layer 5 may be for instance a thin layer of titanium oxide ($TiO_2$) having a high transparency and high refraction index. Other similar materials may be suitable, for instance $Ta_2O_5$, having a high transparency and a high dielectric constant with a consequent high refraction index. Additionally suitable may be any of the transition metals, i.e., those metals that have valence electrons in more than one shell. These transition metals generally labeled as such on Mendeleev tables, or periodic tables of the elements.

The refraction index of the layer 5 has a negligible imaginary component and, being highly transparent, causes a negligible signal loss due to absorption. The transparency range includes the visible light as well as near Infra Red IR and near Ultra Violet UV wavelengths.

An etching step is performed to remove the optional nitride layer 6, when it is present, and the transparent metallic oxide layer 5 from areas other than the regions 1R, 1G and 1B. Then the photoresist mask is removed too.

The third USG oxide layer 4-3 is not etched thus avoiding a possible overetch and related field oxide consumption, thereby preventing a possible active areas widening on the CMOS circuitry and the consequent reduction of the insulating capability of the field oxide.

At this point the three stacks 9 are defined over the diode sensors while the active areas of other CMOS circuitry integrated on the same semiconductor substrate 2 remain already covered by the protecting (undoped) dielectric layer 4-3 which is not removed by the last etching step.

A final process step is then performed to provide a metal dielectric deposition of a BPSG planarizing layer to provide the second planarizing dielectric layer.

Advantageously, the high refraction index layer 5 shown in the FIGS. 1, 2 and 5 are formed by a transparent metallic oxide having a high refraction index.

The high refraction index layer 5 can be obtained through two process steps. A first step provides a first deposition of a metallic titanium and a second process step provides for a thermal oxidation cycle in a controlled environment.

The physical properties of the layer 5 are specifically advantageous in optical applications between 10E13 and 10E16 Hz.

The high refraction index layer 5 is not required to have specific dielectric properties to support static electric fields because there is no need to apply any electric field to such a layer 5.

In the specific case of photodetector for video applications, such as for video cameras and digital cameras, this layer 5 of transparent metallic oxide improves the signal/noise ratio of the light sensor device with respect to the case in which the layer 5 is made by polysilicon.

The process according to embodiments of the present invention allows for improved sensitivity of the sensors in interferential color selecting sensors. This improved sensitivity holds at all optical wavelengths, but becomes particularly evident for wavelengths shorter than that of the yellow color, which means green, blue, violet, and near UV radiation down to at least 250 nm.

Another advantage due to the use of the transparent metallic oxide, is that it allows more flexibility for the design of interferential resonators due to the possibility of using more than one, and not only very thin, high index layers, in order to get interferential transmission spectra of the desired shape (e.g., narrow integrated interferential pass band filters or any other pre-defined shape required for the desired application.

A related advantage is given by the possibility offered by the invention to form a very wide range of spectral transmission curves since the interferential stack can be designed to fit to spectral transmission shape needed, having used a high index transparent material.

In the conventional cases that use organic resins, the number of transmission bands associated with the various dyes is limited to the fixed spectral shapes of the dyes, a problem specifically overcome by embodiments of the invention.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A process for manufacturing an optic sensor device comprising:
   implanting active areas on a semiconductor substrate to obtain a first integrated region of a photosensor;
   forming at least two layers over the photosensor in a stack formation, the at least two layers having different thicknesses and refractive indexes to provide an interferential filter for the photosensor, wherein at least one of the at least two layers is formed from a transparent metallic oxide having a high refraction index.

2. The process according to claim 1 wherein the transparent metallic oxide is formed from a transition metal.

3. The process according to claim 2 wherein the transparent metallic oxide is a titanium oxide.

4. The process according to claim 2 wherein the transparent metallic oxide is a tantalum oxide.

5. The process according to claim 1, further comprising forming a silicon nitride layer over the at least two layers.

6. The process according to claim 1, further comprising:
   forming second and third integrated regions of corresponding photosensors on the substrate; and
   covering the corresponding photosensors with the interferential filter.

7. The process according to claim 6 wherein the interferential filter is formed of different thicknesses of one or more of the at least two layers in places where the interferential filter covers the first, second and third integrated regions.

8. The process according to claim 1, further comprising:

forming a second integrated region of a corresponding photosensor on the substrate; and covering the corresponding photosensor with the interferential filter.

9. The process according to claim 1, wherein the stack comprises a plurality of oxide layers having a low refraction index that are covered by a layer having a high refraction index.

10. A method of forming an optic sensor comprising:

forming a first photosensor in a semiconductor substrate;

depositing a first layer of low refractive index material over the substrate;

patterning and etching a first portion of the first layer of low refractive index material in areas of the substrate other than a second portion of the layer of low refractive index material that is proximate to the first photosensor; and forming a layer of a transparent metallic oxide adjacent to the second portion of the first layer of low refractive index material.

11. The method of claim 10, further comprising:

forming a second photosensor and a third photosensor in the semiconductor substrate;

forming a second layer of a low refractive index material disposed on the second photosensor;

forming a third layer of a low refractive index material disposed on the third photosensor; and forming a layer of the transparent metallic oxide adjacent to the second and third layers of the low refractive index material.

12. The method of claim 11 wherein forming a second layer of a low refractive index material comprises forming a layer of the same low refractive index material disposed over the substrate, but having a different thickness than the layer disposed over the substrate.

13. The method of claim 10, further comprising:

forming a second photosensor in the semiconductor substrate;

forming a first and second portions of a second layer of the low refractive index material on the first and second photosensors, respectively; and forming layer of a transparent metallic oxide adjacent to the second layer of the low refractive index material.

14. The method of claim 13 wherein forming the first and second portions the second layer comprises forming the first and second portions of the second layer in different thicknesses with respect to each other.

15. The method of claim 11 wherein forming a layer of a transparent metallic oxide comprises forming a layer of an oxide of a transition metal.

16. The method of claim 11 wherein forming a layer of a transparent metallic oxide comprises forming a layer of titanium oxide.

17. The method of claim 11 wherein forming a layer of a transparent metallic oxide comprises forming a layer of tantalum oxide.

18. The method of claim 10, wherein forming a layer of a transparent metallic oxide adjacent to the second portion of the first layer comprises forming a layer of a transparent high refractive index metallic oxide.

19. The method of claim 11, wherein forming a layer of a transparent metallic oxide adjacent to the second and third layers of the low refractive index material comprises forming a layer of a transparent high refractive index metallic oxide.

20. The method of claim 11 wherein forming a layer of a transparent metallic oxide comprises forming a layer of a high refractive index metallic oxide of a transition metal.

21. The method of claim 11 wherein forming a layer of a transparent metallic oxide comprises forming a layer of a high refractive index metallic oxide of a transition metal.

22. The method of claim 11 wherein forming a layer of a transparent metallic oxide comprises forming a layer of a high refractive index metallic oxide of a transition metal.

* * * * *